United States Patent
Chen

(10) Patent No.: US 7,041,900 B2
(45) Date of Patent: May 9, 2006

(54) INLET WITH HEAT-INSULATION FUNCTION

(75) Inventor: Chun-Chen Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 10/935,588

(22) Filed: Sep. 7, 2004

(65) Prior Publication Data

US 2005/0142927 A1 Jun. 30, 2005

(30) Foreign Application Priority Data

Dec. 30, 2003 (TW) .............................. 92137530 A

(51) Int. Cl.
*H02G 3/08* (2006.01)
*H01R 13/00* (2006.01)

(52) U.S. Cl. .................. 174/50; 174/17 VA; 174/52.1; 439/485; 361/676; 361/688

(58) Field of Classification Search ............ 174/65 R, 174/50, 52.1, 59, 64, 135, 252, 94 R, 94 S, 174/84 C, 17 VA; 361/600, 641, 676, 679, 361/683, 687, 688, 728; 439/76.1, 892, 893, 439/933, 620, 108, 607, 949, 485, 906, 487, 439/106, 874, 875, 876, 96, 95, 877, 878, 439/879, 880, 881, 882

See application file for complete search history.

(56) References Cited

U.S. PATENT DOCUMENTS

| | | | | |
|---|---|---|---|---|
| 5,213,524 A | * | 5/1993 | Okamoto et al. | 439/620 |
| 5,554,050 A | * | 9/1996 | Marpoe, Jr. | 439/620 |
| 6,305,985 B1 | * | 10/2001 | Akiha | 439/607 |
| 6,430,054 B1 | * | 8/2002 | Iwata | 174/52.1 |
| 6,537,113 B1 | * | 3/2003 | Chen | 439/76.1 |
| 6,600,658 B1 | * | 7/2003 | Iwata | 174/50 |
| 6,776,650 B1 | * | 8/2004 | Cheng et al. | 439/76.1 |
| 6,881,069 B1 | * | 4/2005 | Chen | 439/13 |
| 6,893,274 B1 | * | 5/2005 | Chen et al. | 439/106 |
| 6,894,903 B1 | * | 5/2005 | Sato et al. | 361/728 |

* cited by examiner

*Primary Examiner*—Angel R. Estrada
(74) *Attorney, Agent, or Firm*—Madson & Austin

(57) ABSTRACT

An AC inlet with heat-insulation function disposed in an opening of an electronic apparatus is disclosed. The inlet comprises a main body having an indentation portion disposed on a first side thereof, and the indentation portion having at least a conducting terminal and at least a hole, at least a connecting piece disposed on a second side opposite to the first side, and having one end connected with the conducting terminal, at least a conducting element having one end connected with the connecting piece and the other end connected with the circuit system in the electronic apparatus, a heat-insulation element covering the connecting piece and forming a space between the main body and the heat-insulation element, wherein the heat-insulation element has at least an opening for passing the conducting element therethrough. Thereby the air in the space circulates with the external air through the hole in the indentation portion of the main body.

18 Claims, 3 Drawing Sheets

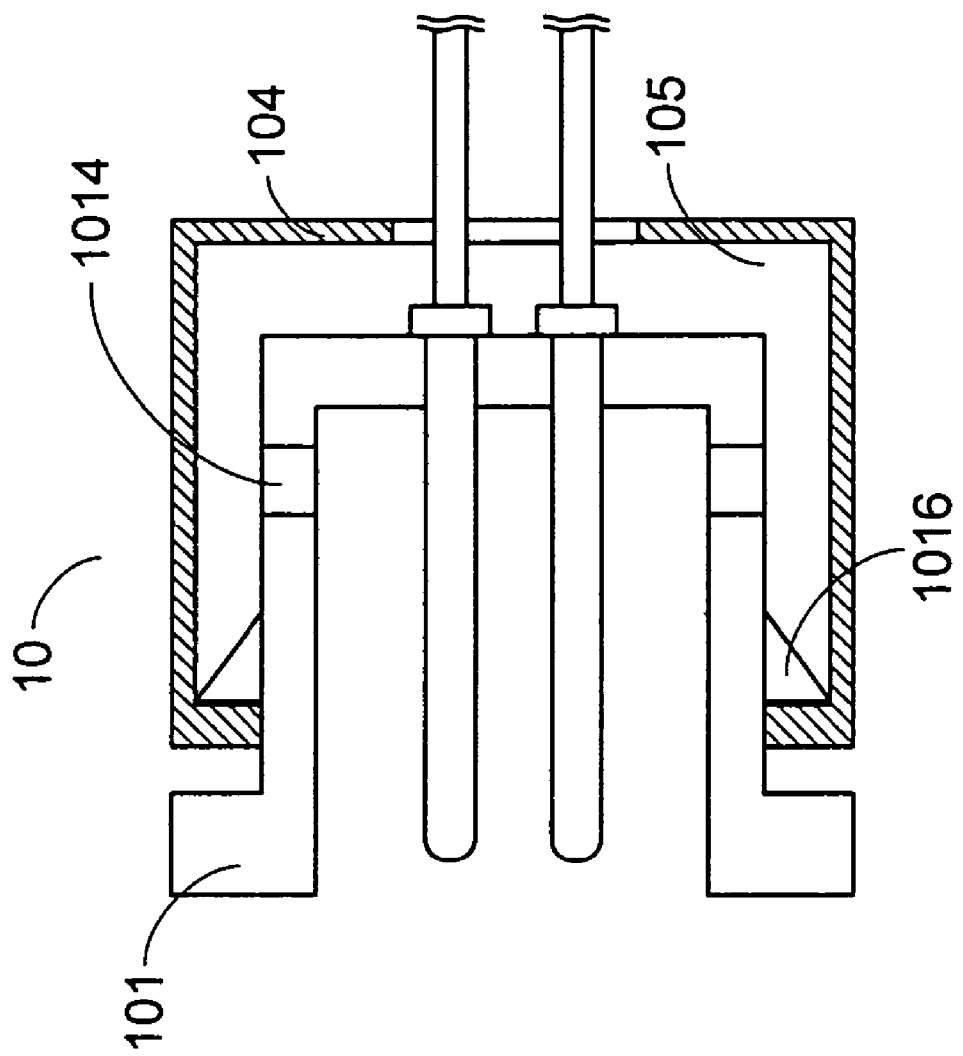

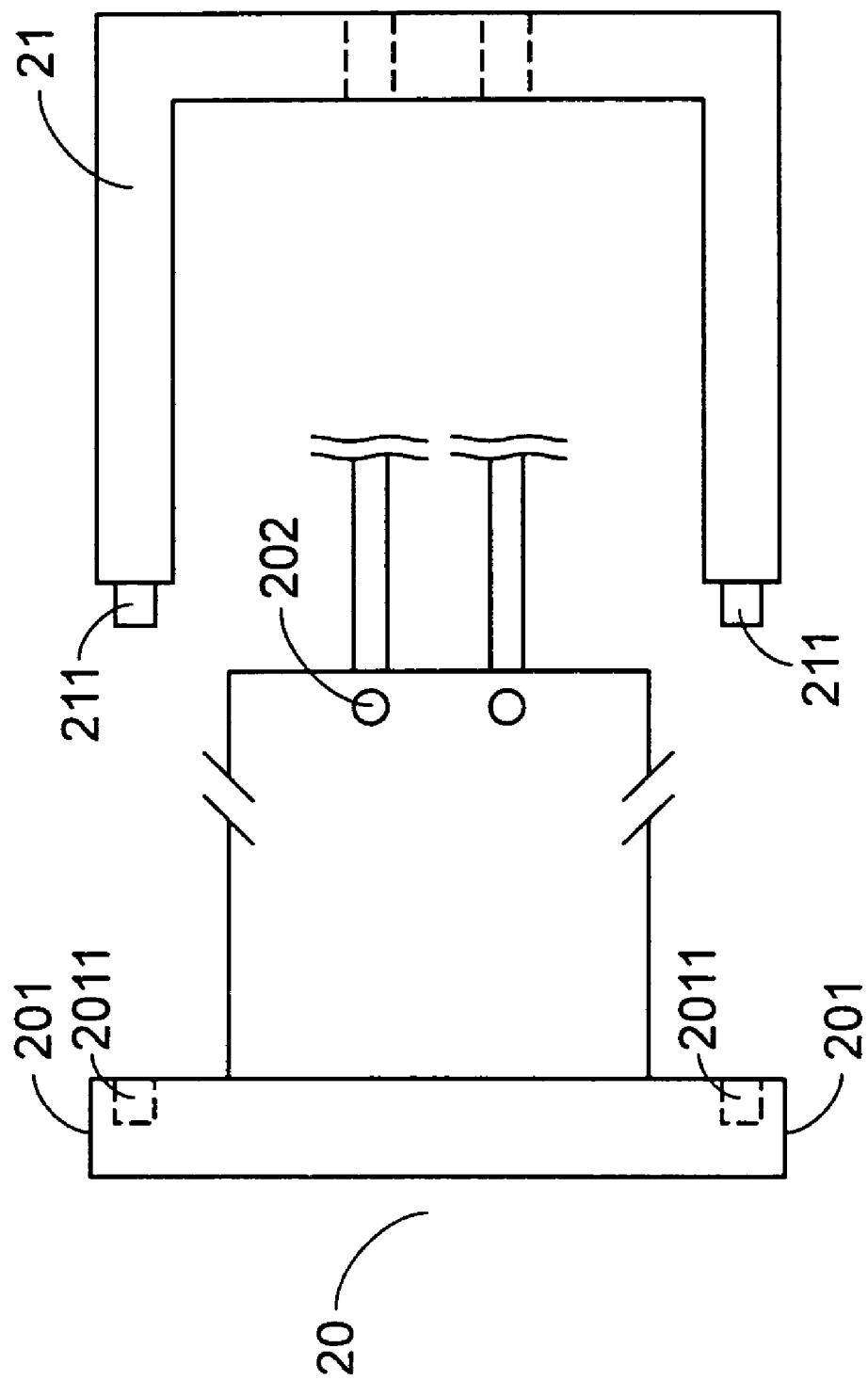

INLET WITH HEAT-INSULATION FUNCTION

FIELD OF THE INVENTION

The present invention relates to an AC inlet with heat-insulation function, and more particularly to an AC inlet with heat-insulation function for use in an adapter.

BACKGROUND OF THE INVENTION

Generally, for adapting to AC cables with different specifications and sizes in various countries, an adapter usually includes an AC inlet for electrically connecting to other electronic apparatuses. According to the international IC 320 standard safety temperature value, the operation temperature of the AC inlet of the adapter for connecting different AC cables of various countries should be lower than the standard value. However, conventionally, the adapter used in electronic products will consume partial electric power when being operated. Furthermore, along with the technology development of electronic products and in response to the user's requirements, more and more electric units are loaded on the printed circuit board inside the electronic product, resulting in the increase of the integration of the electric units. Currently, the electric power for operating most adapters has increased to 100~200 Watts, even over 200 Watts. Since the Watt consumption increases, it is inevitably that the temperature of the whole adapter is increased due to the heat generated from the operation of the adapter. It also increases the difficulty for solving the temperature problem of the AC inlet. It is necessary to consider the international standard safety temperature value of the AC inlet when the adapter is designed and manufactured. Therefore, for complying with the standard, the internal structure of adapter must be well designed to improve the heat dissipating effect, for example the DC fan addition. However, it causes the cost increase and the structure change of the AC inlet.

Therefore, the purpose of the present invention is to develop an AC inlet with heat-insulation function for efficiently insulating the heat generated from the adapter to deal with the above problems encountered in the prior art.

SUMMARY OF THE INVENTION

An object of the present invention is to provide an AC inlet with heat-insulation function, which includes holes disposed in the indentation portion that is used to accommodate the conducting terminals, so that the air in the space between the heat-insulation element and the main body of the AC inlet can circulate with the external air. On the other hand, the connecting pieces of the AC inlet can be covered by the heat-insulation element, and thus, the heat generated from the internal operation of the electronic apparatus will not directly influence the connecting pieces. Therefore, the over-temperature condition of the AC inlet can be avoided to comply with the international IC 320 standard.

According to an aspect of the present invention, there is provided an AC inlet with heat-insulation function disposed in an opening of an electronic apparatus. The inlet comprises a main body having an indentation portion disposed on a first side thereof, and the indentation portion having at least a conducting terminal and at least a hole, at least a connecting piece disposed on a second side opposite to the first side, and having one end connected with the conducting terminal, at least a conducting element having one end connected with the connecting piece and the other end connected with the circuit system in the electronic apparatus, a heat-insulation element covering the connecting piece and forming a space between the main body and the heat-insulation element, wherein the heat-insulation element has at least an opening for passing the conducting element therethrough. Thereby the air in the space circulates with the external air through the hole in the indentation portion of the main body.

In an embodiment, the heat-insulation element is secured to the main body by engagement, ultrasonic welding, riveting, or thermal molding.

In an embodiment, the conducting element is a power cord or a pin.

In an embodiment, the main body further comprises a fixing device. For example, the fixing device is a protruding rib.

In an embodiment, the space accommodates a heat-insulating material including air, polyfoam or heat-insulating cotton.

In an embodiment, the heat-insulation element comprises a hollow portion, which can accommodate a heat-insulating material including air, polyfoam or heat-insulating cotton.

In an embodiment, the electronic apparatus is an adapter or a power supply.

According to another aspect of the present invention, there is provided an electronic apparatus having an AC inlet with heat-insulation function. The electronic apparatus comprises a casing having an opening, and an inlet with heat-insulation function disposed in the opening of the electronic apparatus. The inlet comprises a main body having an indentation portion disposed on a first side thereof, and the indentation portion having at least a conducting terminal and at least a hole, at least a connecting piece disposed on a second side opposite to the first side, and having one end connected with the conducting terminal, at least a conducting element having one end connected with the connecting piece and the other end connected with the circuit system in the electronic apparatus, a heat-insulation element covering the connecting piece and forming a space between the main body and the heat-insulation element, wherein the heat-insulation element has at least an opening for passing the conducting element therethrough. Thereby the air in the space circulates with the external air through the hole in the indentation portion of the main body.

In an embodiment, the heat-insulation element is secured to the main body by engagement, ultrasonic welding, riveting, or thermal molding.

In an embodiment, the conducting element is a power cord or a pin.

In an embodiment, the main body further comprises a fixing device. For example, the fixing device is a protruding rib.

In an embodiment, the space accommodates a heat-insulating material including air, polyfoam or heat-insulating cotton.

In an embodiment, the heat-insulation element comprises a hollow portion, which can accommodate a heat-insulating material including air, polyfoam or heat-insulating cotton.

In an embodiment, the electronic apparatus is an adapter or a power supply.

The above objects and advantages of the present invention will become more readily apparent to those ordinarily skilled in the art after reviewing the following detailed description and accompanying drawings, in which:

BRIEF DESCRIPTION OF THE DRAWINGS

FIG. 1(b) is a top view of the cross-section of the assembled structure of the heat-insulation element and the main body of the AC inlet in FIG. 1(a); and FIG. 2 is a schematic diagram showing the AC inlet with heat-insulation function according to another preferred embodiment of the present invention.

DETAILED DESCRIPTION OF THE PREFERRED EMBODIMENT

Figure 1A:
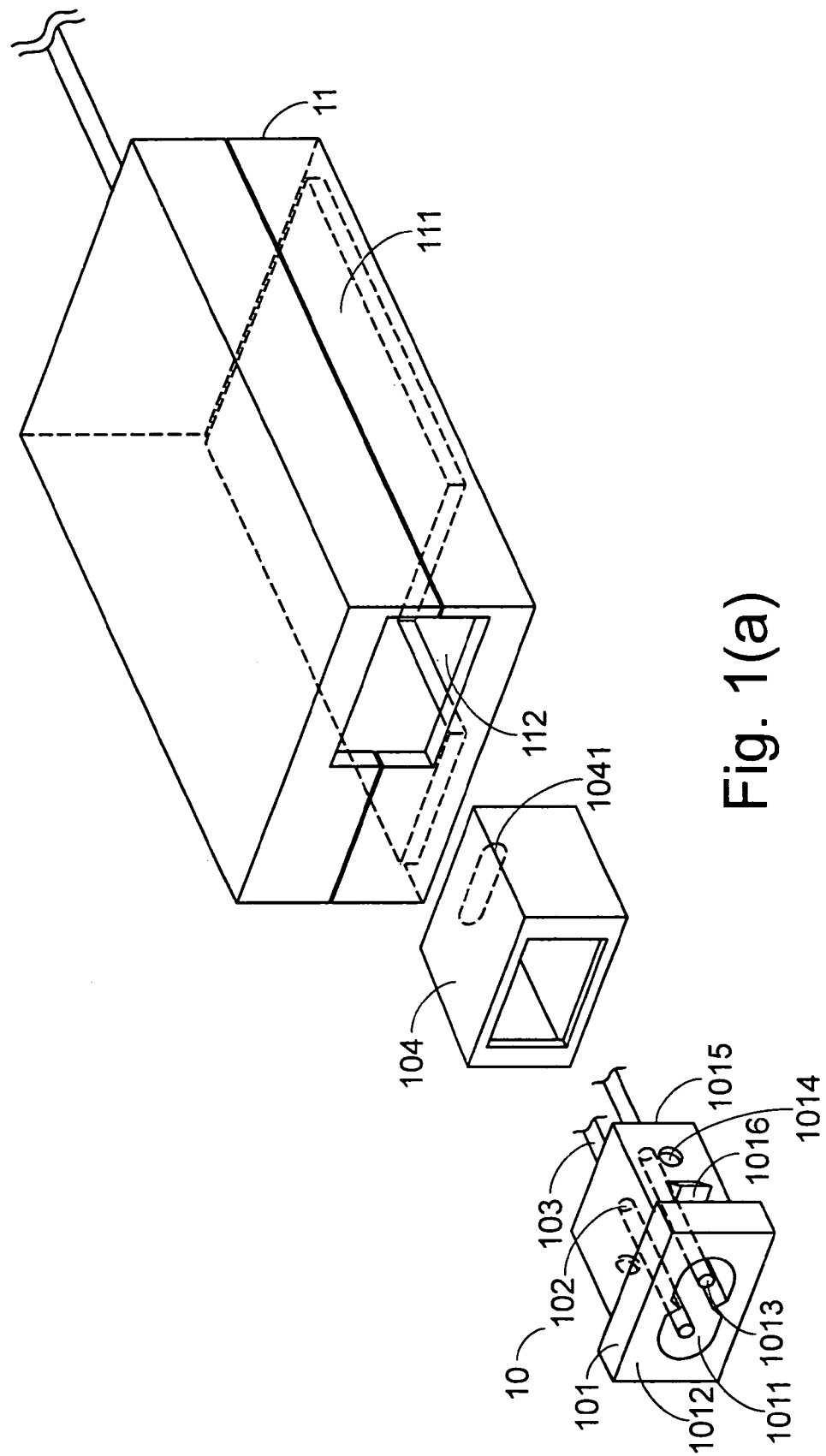
FIG. 1(a) is a schematic diagram showing an adapter having an AC inlet with heat-insulation function according to a preferred embodiment of the present invention.

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The present invention provides an AC inlet with heat-insulation function, which includes holes disposed in the indentation portion that is used to accommodate the conducting terminals, so that the air in the space between the heat-insulation element and the main body of the AC inlet can circulate with the external air. On the other hand, the connecting pieces of the AC inlet can be covered by the heat-insulation element, and thus, the heat generated from the internal operation of the electronic apparatus will not directly influence the connecting pieces. Through such designs, the over-temperature condition of the AC inlet can be avoided to comply with the international IC 320 standard.

The AC inlet with heat-insulation function of the present invention can be applied to a common electronic apparatus, such as an adapter or a power supply. The following embodiments use the adapter as examples to collocate with the AC inlet for describing the technique of the present invention more specifically; however, they are not used to limit the applicable electronic apparatus or the practicing manner of the present invention.

Please refer to FIG. 1(a), which is a schematic diagram showing an adapter having an AC inlet with heat-insulation function according to a preferred embodiment of the present invention. As shown in FIG. 1(a), the adapter 11 includes an internal printed circuit board 111, which has a plurality of electronic elements and many control circuits (not shown) disposed thereon, so that the adapter 11 can be normally operated. In addition, the adapter 11 further includes an opening 112 for accommodating an AC inlet 10. As shown in FIG. 1, the AC inlet of the present invention mainly includes a main body 101, two connecting pieces 102, two conducting elements 103 and a heat-insulation element 104. The main body 101 of the AC inlet 10 further includes an indentation portion 1011 disposed on a first side 1012 thereof. There are two conducting terminals 1013 and at least a hole 1014 disposed in the indentation portion 1011, in which one end of the conducting terminal 1013 is connected with the connecting piece 102 of the AC inlet 10, and the hole 1014 can be positioned on any side of the indentation portion 1011. Furthermore, the connecting pieces 102 are positioned correspondingly to the conducting terminals 1013 on a second side 1015, opposite to the first side 1012, of the main body 101 of the AC inlet 10, and connected with the conducting elements 103 that is connected to the printed circuit board 111 in the adapter 11, so as to conduct the AC inlet 10 and the adapter 10. Moreover, the heat-insulation element 104 further includes an opening 1041 for the conducting elements 103 to pass through, and it can be approximately bowl-shaped so as to enclose the connecting pieces 102 on the second side 1015 of the main body 101.

Please refer to FIG. 1(b), which is a top view of the cross-section of the assembled structure of the heat-insulation element 104 and the main body 101 of the AC inlet 10 in FIG. 1(a). As shown in FIG. 1(b), the heat-insulation element 104 and the main body 101 of the AC inlet 10 can be assembled and fixed via the protruding rib 1016 positioned on the two sides of the main body 101, and a space 105 is formed between the AC inlet 10 and the heat-insulation element 104 for accommodating heat-insulation materials, such as air, polyfoam or heat-insulating cotton. Thereby, an insulating wall can be formed between the adapter 11 and the AC inlet 10 to prevent the heat of the adapter 11 from being transmitted to the AC inlet 10, so as to prevent the temperature rise of the AC inlet 10.

Apparently, as shown in FIGS. 1(a) and 1(b), the main body 101 of the AC inlet 10 includes at least a hole 1014 in the indentation portion 1011, so the air in the space 105 can circulate with the external air. Therefore, when the adapter 11 starts to be operated and the heat is generated by the internal printed circuit board 111 and gradually transmitted to the AC inlet 10, the heat-insulation element 104 can initially insulate partial heat, so that the temperature of the AC inlet 10 will not increase rapidly. When the temperature of the air in the space 105 between the heat-insulation element 104 and the AC inlet 10 gradually increases due to the heat transmitted from the adapter 11 and the temperature difference between the air in the space 105 and the external air is to a certain extent, the hotter air in the space 105 will circulate with the colder external air. Accordingly, the heat of the AC inlet 10 can be dissipated via the flowing air, and certainly, the temperature of the AC inlet 10 will not exceed the temperature standard. Therefore, the over-temperature condition of the AC inlet 10 can be avoided to comply with the international IC 320 standard.

Besides, the heat-insulation element can include a hollow portion, which can be filled with an insulating material, such as air, polyfoam or heat-insulating cotton, to further enhance the heat-insulation effect.

In addition, according to the AC inlet with heat-insulation function of the present invention, the heat-insulation element can be further secured to the main body of the AC inlet. Please refer to FIG. 2, which is a schematic diagram showing the AC inlet with heat-insulation function according to another preferred embodiment of the present invention. As shown in FIG. 2, the backside of the front portion 201 of the main body 20 of the AC inlet includes a plurality of recesses 201, and the heat-insulation element 21 includes a plurality of rivets 211 at the positions corresponding to the recesses 201. When the heat-insulation element 21 and the main body 20 of the AC inlet are assembled, the rivets 211 can be riveted into the recesses 201, such that the heat-insulation elements 21 can be tightly secured to the main body 20 of the AC inlet, so as to ensure the connecting pieces 202 of the AC inlet can be completely covered by the heat-insulation element 21 for insulating the heat transmitted from the internal circuit system of the electronic apparatus (not shown). Certainly, except by riveting, the heat-insulation element can also be assembled with the main body of the AC inlet by engagement, ultrasonic welding or thermal molding to position the heat-insulation element and further insulate the heat transmitted from the internal circuit system of the electronic apparatus (not shown).

Certainly, the embodiments of the present invention can have many variations. For example, as described in the second embodiment, the space can be filled with heat-insulating materials to enhance the heat-insulation effect and protect the connecting pieces. Moreover, the type and material of the conducting element of the present invention are not limited; a general power cord or pin can be applied to the AC inlet with heat-insulation function of the present invention.

In conclusion, the AC inlet with heat-insulation function of the present invention has holes disposed in the indentation portion of the main body of the AC inlet for air flowing. More particularly, the AC inlet includes a heat-insulation element for covering the connecting pieces on the backside of the AC inlet, and separating the adapter and the AC inlet into two air chambers; thereby, on one hand, the heat transmitted from the printed circuit board in the adapter can be mostly insulated, and on the other hand, the air in the space between AC inlet and the heat-insulation element can circulate with the external air to further dissipate the heat of the AC inlet. Hence, the temperature of the AC inlet will not exceed the international IC 320 standard value. Therefore, the present invention overcomes the disadvantages of the prior art and possesses industrial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An inlet with heat-insulation function disposed in an opening of an electronic apparatus, comprising:
   a main body having an indentation portion disposed on a first side thereof, and said indentation portion having at least a conducting terminal and at least a hole;
   at least a connecting piece disposed on a second side opposite to said first side, and having one end connected with said conducting terminal;
   at least a conducting element having one end connected with said connecting piece and the other end connected with a circuit system in said electronic apparatus;
   a heat-insulation element covering said connecting piece and forming a space between said main body and said heat-insulation element, wherein said heat-insulation element has at least an opening for passing said conducting element therethrough;
   thereby an air in said space circulates with an external air through said hole in said indentation portion of said main body.

2. The inlet according to claim 1 wherein said heat-insulation element is secured to said main body by engagement, ultrasonic welding, riveting, or thermal molding.

3. The inlet according to claim 1 wherein said conducting element is a power cord or a pin.

4. The inlet according to claim 1 wherein said main body further comprises a fixing device.

5. The inlet according to claim 4 wherein said fixing device is a protruding rib.

6. The inlet according to claim 1 wherein said space accommodates a heat-insulating material including air, polyfoam or heat-insulating cotton.

7. The inlet according to claim 1 wherein said heat-insulation element comprises a hollow portion.

8. The inlet according to claim 7 wherein said hollow portion accommodates a heat-insulating material including air, polyfoam or heat-insulating cotton.

9. The inlet according to claim 1 wherein said electronic apparatus is an adapter or a power supply.

10. An electronic apparatus, comprising:
    a casing having an opening; and
    an inlet with heat-insulation function disposed in said opening of said electronic apparatus, and said inlet comprising:
    a main body having an indentation portion disposed on a first side thereof, and said indentation portion having at least a conducting terminal and at least a hole;
    at least a connecting piece disposed on a second side opposite to said first side, and having one end connected with said conducting terminal;
    at least a conducting element having one end connected with said connecting piece and the other end connected with a circuit system in said electronic apparatus;
    a heat-insulation element covering said connecting piece and forming a space between said main body and said heat-insulation element, wherein said heat-insulation element has at least an opening for passing said conducting element therethrough;
    thereby an air in said space circulates with an external air through said hole in said indentation portion of said main body.

11. The electronic apparatus according to claim 10 wherein said heat-insulation element is secured to said main body by engagement, ultrasonic welding, riveting, or thermal molding.

12. The electronic apparatus according to claim 10 wherein said conducting element is a power cord or a pin.

13. The electronic apparatus according to claim 10 wherein said main body further comprises a fixing device.

14. The electronic apparatus according to claim 13 wherein said fixing device is a protruding rib.

15. The electronic apparatus according to claim 10 wherein said space accommodates a heat-insulating material including air, polyfoam or heat-insulating cotton.

16. The electronic apparatus according to claim 10 wherein said heat-insulation element comprises a hollow portion.

17. The electronic apparatus according to claim 16 wherein said hollow portion accommodates a heat-insulating material including air, polyfoam or heat-insulating cotton.

18. The electronic apparatus according to claim 10 wherein said electronic apparatus is an adapter or a power supply.

* * * * *